United States Patent
Chou et al.

(10) Patent No.: US 9,484,246 B2
(45) Date of Patent: Nov. 1, 2016

(54) BURIED SIGNAL TRANSMISSION LINE

(71) Applicant: GLOBALFOUNDRIES INC., Grand Cayman (KY)

(72) Inventors: Anthony I. Chou, Beacon, NY (US); Arvind Kumar, Beacon, NY (US); Sungjae Lee, Burlington, VT (US); Richard A. Wachnik, Mount Kisco, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/307,604

(22) Filed: Jun. 18, 2014

(65) Prior Publication Data
US 2015/0371893 A1 Dec. 24, 2015

(51) Int. Cl.
H01L 21/20 (2006.01)
H01L 21/762 (2006.01)
H01L 21/84 (2006.01)
H01L 21/74 (2006.01)
H01L 27/12 (2006.01)

(52) U.S. Cl.
CPC ....... *H01L 21/76283* (2013.01); *H01L 21/743* (2013.01); *H01L 21/84* (2013.01); *H01L 27/1203* (2013.01); *H01L 2924/0002* (2013.01)

(58) Field of Classification Search
None
See application file for complete search history.

(56) References Cited

U.S. PATENT DOCUMENTS

| | | |
|---|---|---|
| 6,756,673 B2 | 6/2004 | Ahn et al. |
| 7,186,596 B2 | 3/2007 | Min et al. |
| 8,274,343 B2 | 9/2012 | Cho |
| 8,461,012 B2 | 6/2013 | Trivedi |
| 2012/0286392 A1* | 11/2012 | Pei .................... H01L 27/10829 257/532 |
| 2014/0167213 A1* | 6/2014 | Ficke .................. H01L 21/761 257/510 |

OTHER PUBLICATIONS

Bashir, R. et al., "Back-Gated Buried Oxide MOSFET's in a High-Voltage Bipolar Technology for Bonded Oxide/SOI Interface Characterization" IEEE Electron Device Letters (Aug. 1998) pp. 282-284, vol. 19, No. 8.

Salman, A.A. et al., "ESD Protection for SOI Technology Using Under-the-BOX (Substrate) Diode Structure" IEEE Transactions on Device and Materials Reliability (Jun. 2006) pp. 292-299, vol. 6, No. 2.

(Continued)

*Primary Examiner* — Fernando L Toledo
*Assistant Examiner* — Valerie N Newton
(74) *Attorney, Agent, or Firm* — Scully, Scott, Murphy & Presser, P.C.

(57) ABSTRACT

A buried conductive layer is formed underneath a buried insulator layer of a semiconductor-on-insulator (SOI) substrate. A deep isolation trench laterally surrounding a portion of the buried conductive layer is formed, and is filled with at least a dielectric liner to form a deep capacitor trench isolation structure. Contact via structures are formed through the buried insulator layer and a top semiconductor layer and onto the portion of the buried conductive layer, which constitutes a buried conductive conduit. The deep capacitor trench isolation structure may be formed concurrently with at least one deep trench capacitor. A patterned portion of the top semiconductor layer may be employed as an additional conductive conduit for signal transmission. Further, the deep capacitor trench isolation structure may include a conductive portion, which can be electrically biased to control the impedance of the signal path including the buried conductive conduit.

10 Claims, 13 Drawing Sheets

(56) References Cited

OTHER PUBLICATIONS

Chan, M. et al., "SOI/bulk hybrid technology on SIMOX wafers for high performance circuits with good ESD immunity" IEEE Electron Device Letters (Jan. 1995) pp. 11-13, vol. 16, No. 1.

Zhang, F. et al., "CPW Transmission Insertion Loss on SI and SOI Substrates" Microwave Journal (Nov. 1, 2005) pp. 138, vol. 48, No. 11.

Lihiji, R.R. et al., "3-D CMOS Circuits Based on Low-Loss Vertical Interconnects on Parylene-N" IEEE Transactions on Microwave Theory and Techniques (Jan. 2010) pp. 48-56, vol. 58, No. 1.

* cited by examiner

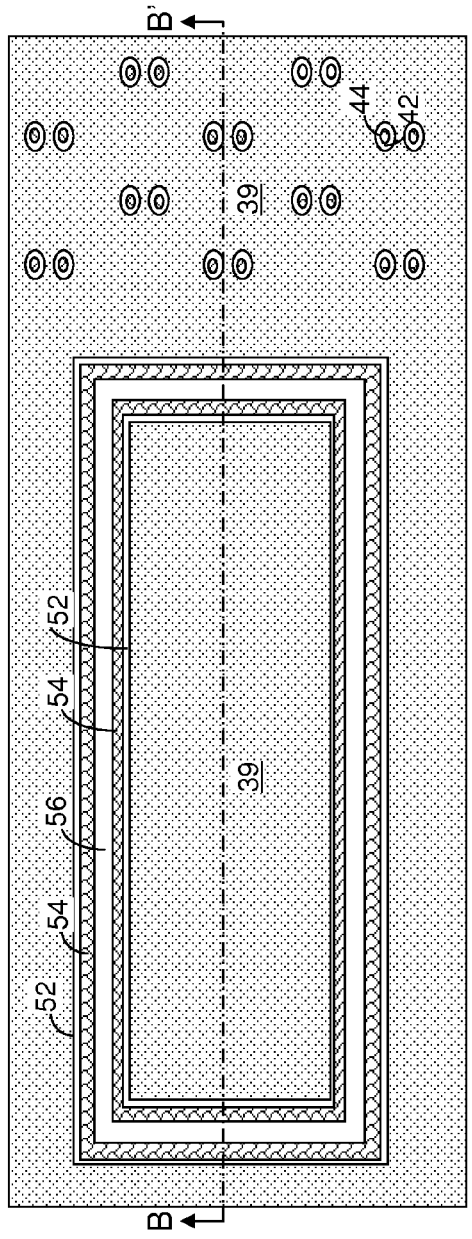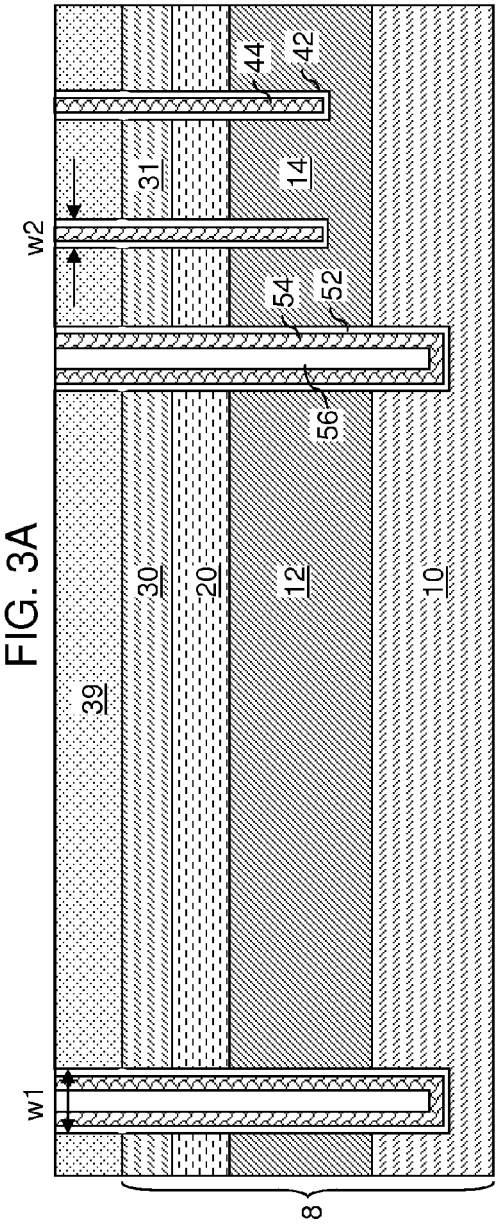
FIG. 3A
FIG. 3B

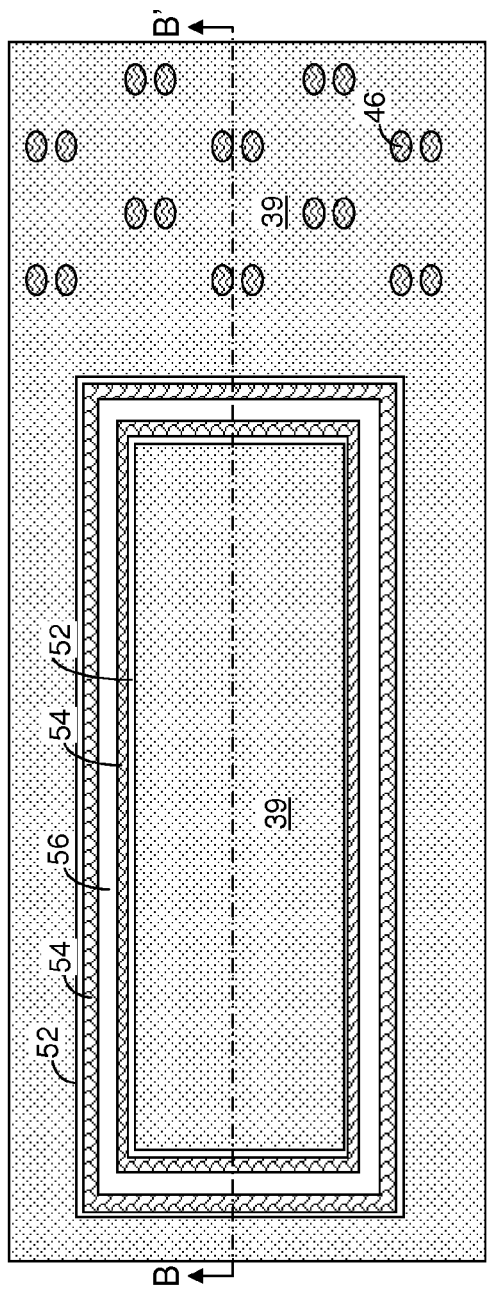
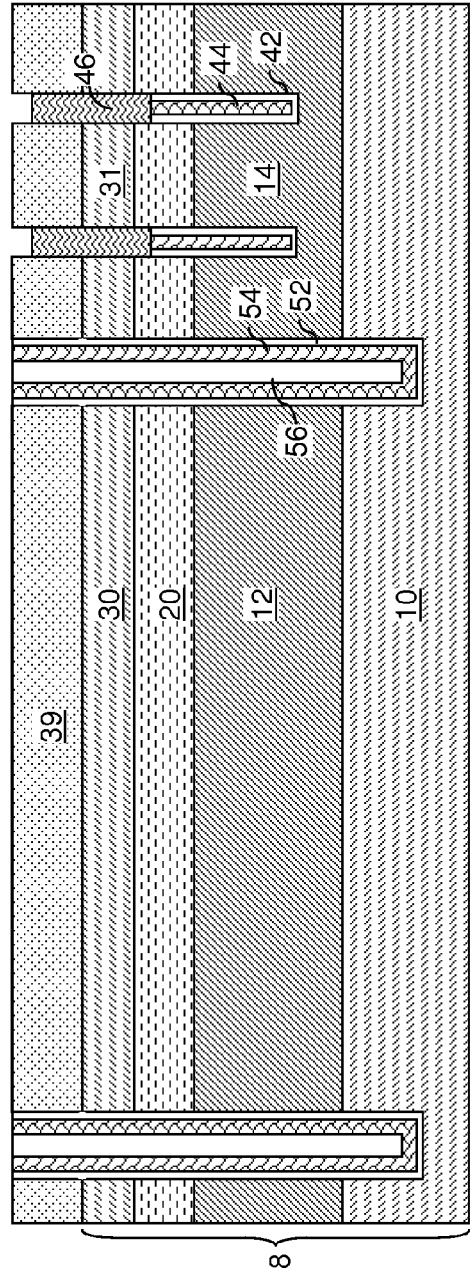
FIG. 4A
FIG. 4B

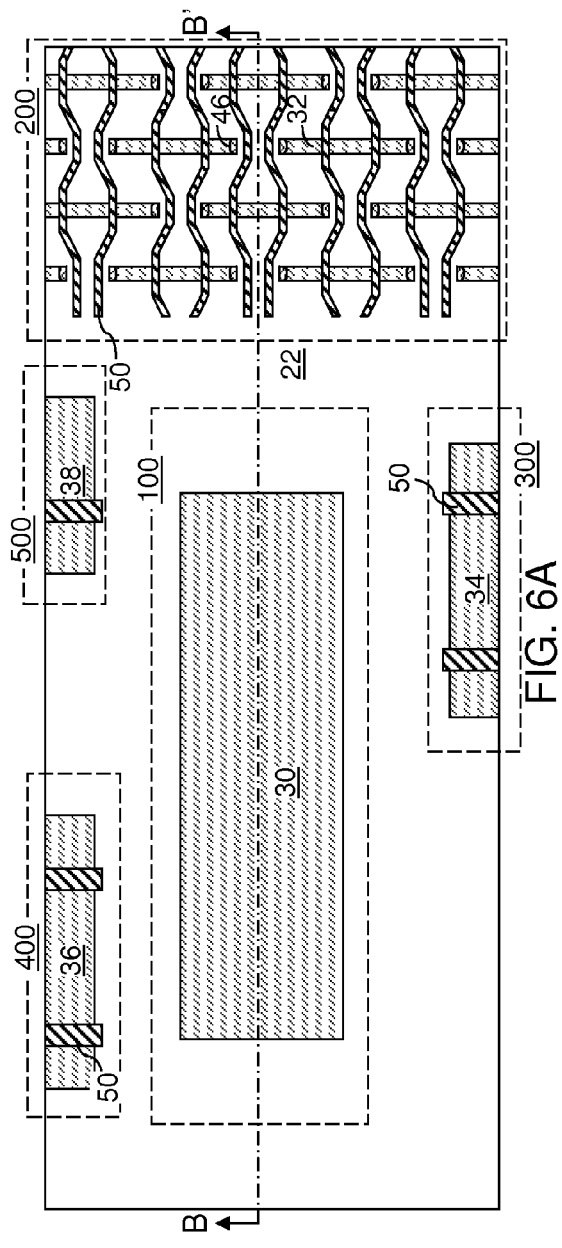
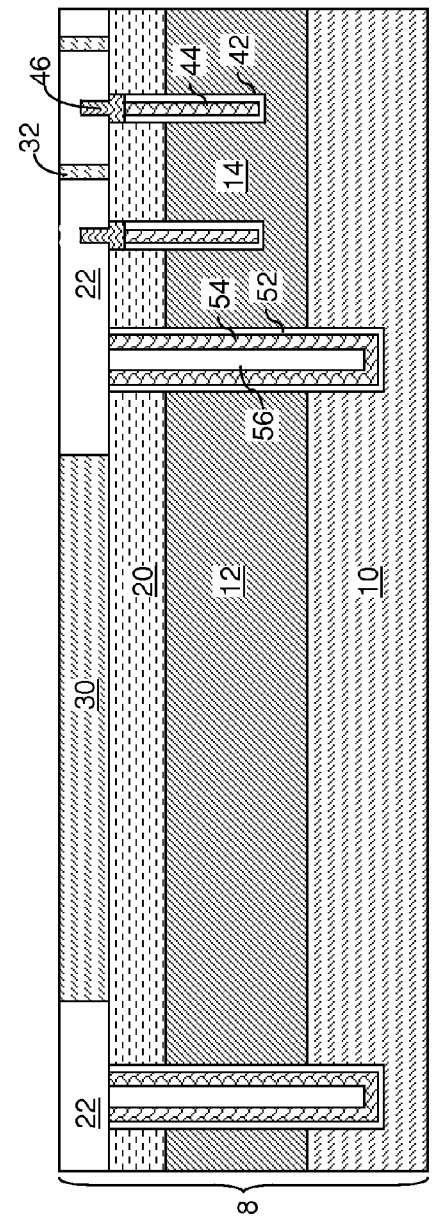
FIG. 6A
FIG. 6B

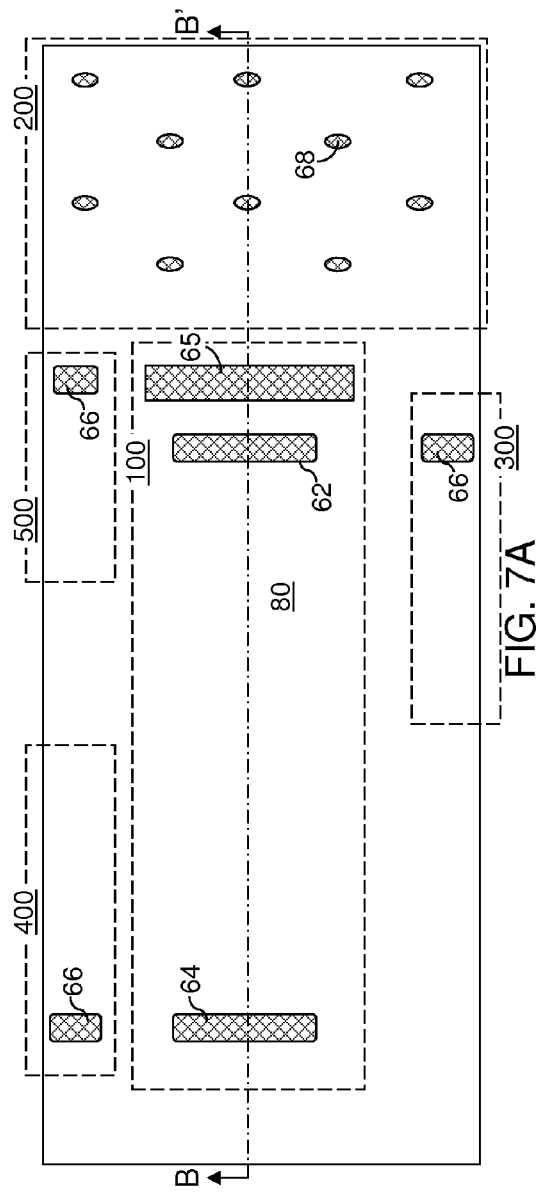
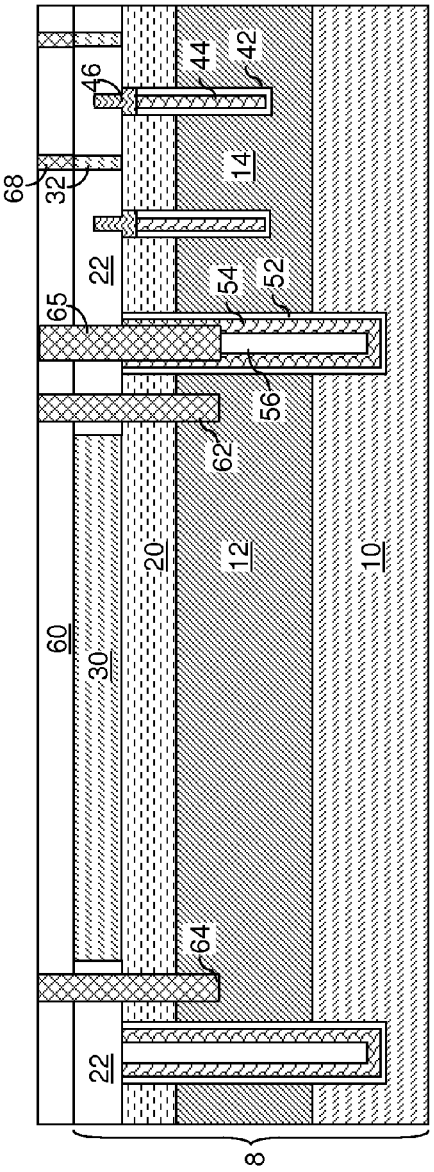
FIG. 7A
FIG. 7B

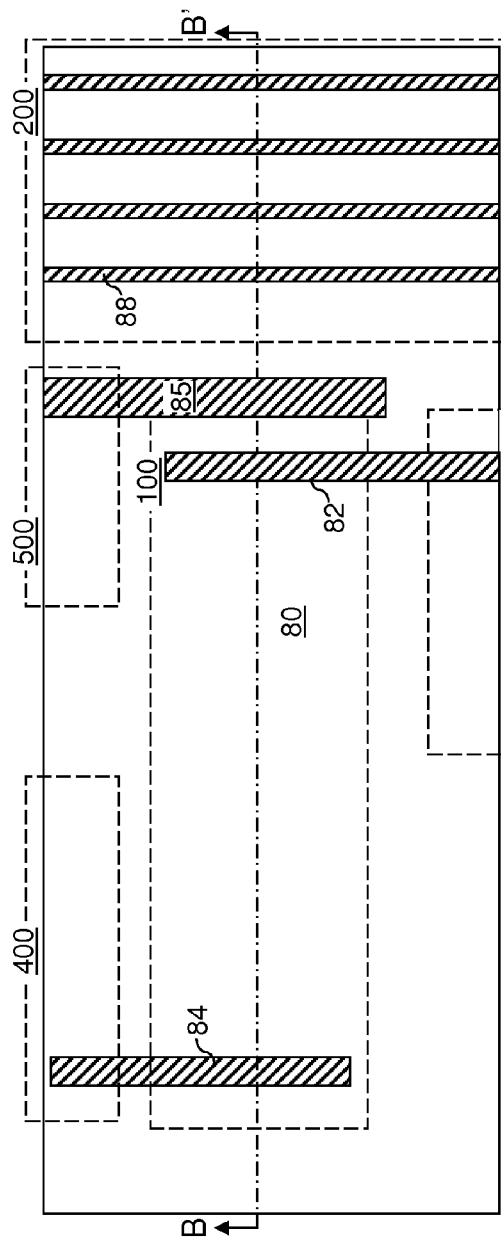
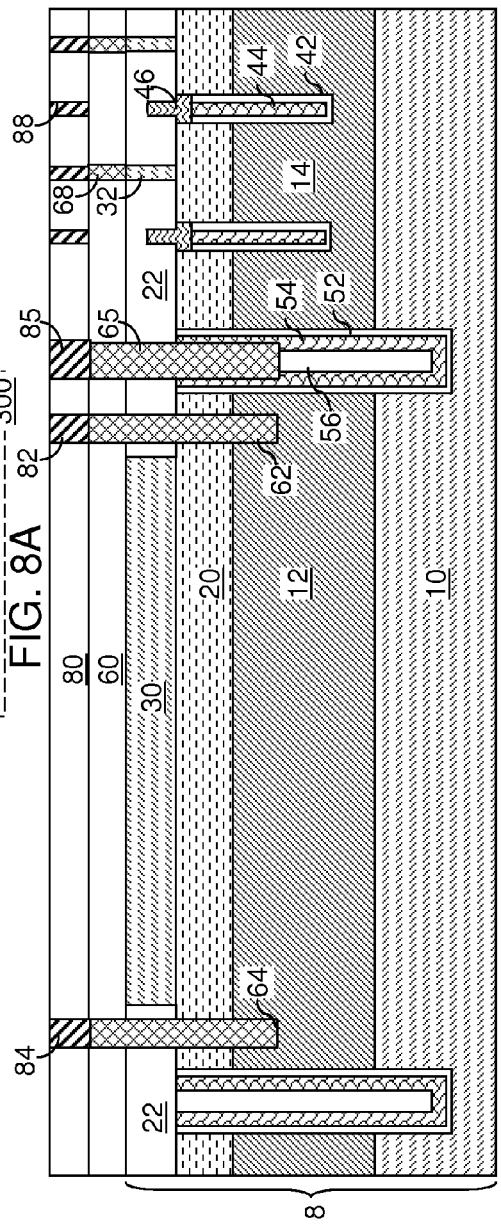
FIG. 8A
FIG. 8B

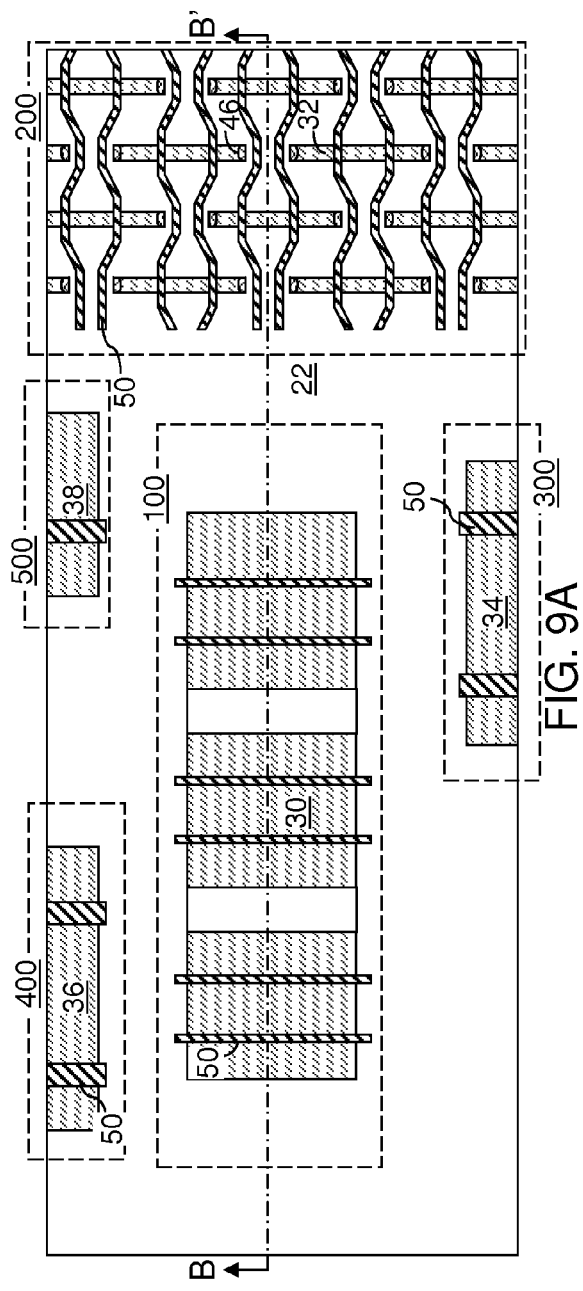
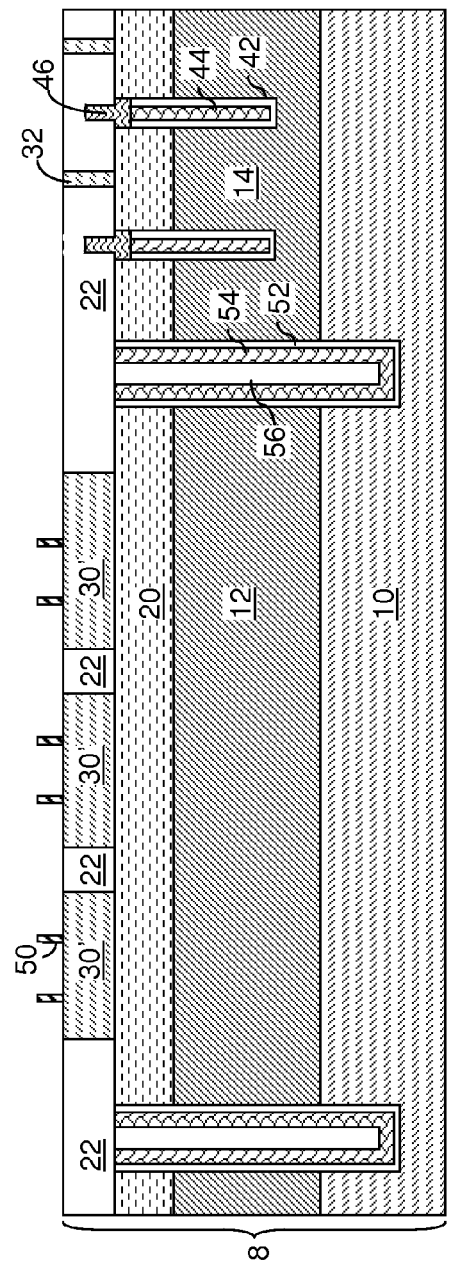
FIG. 9A
FIG. 9B

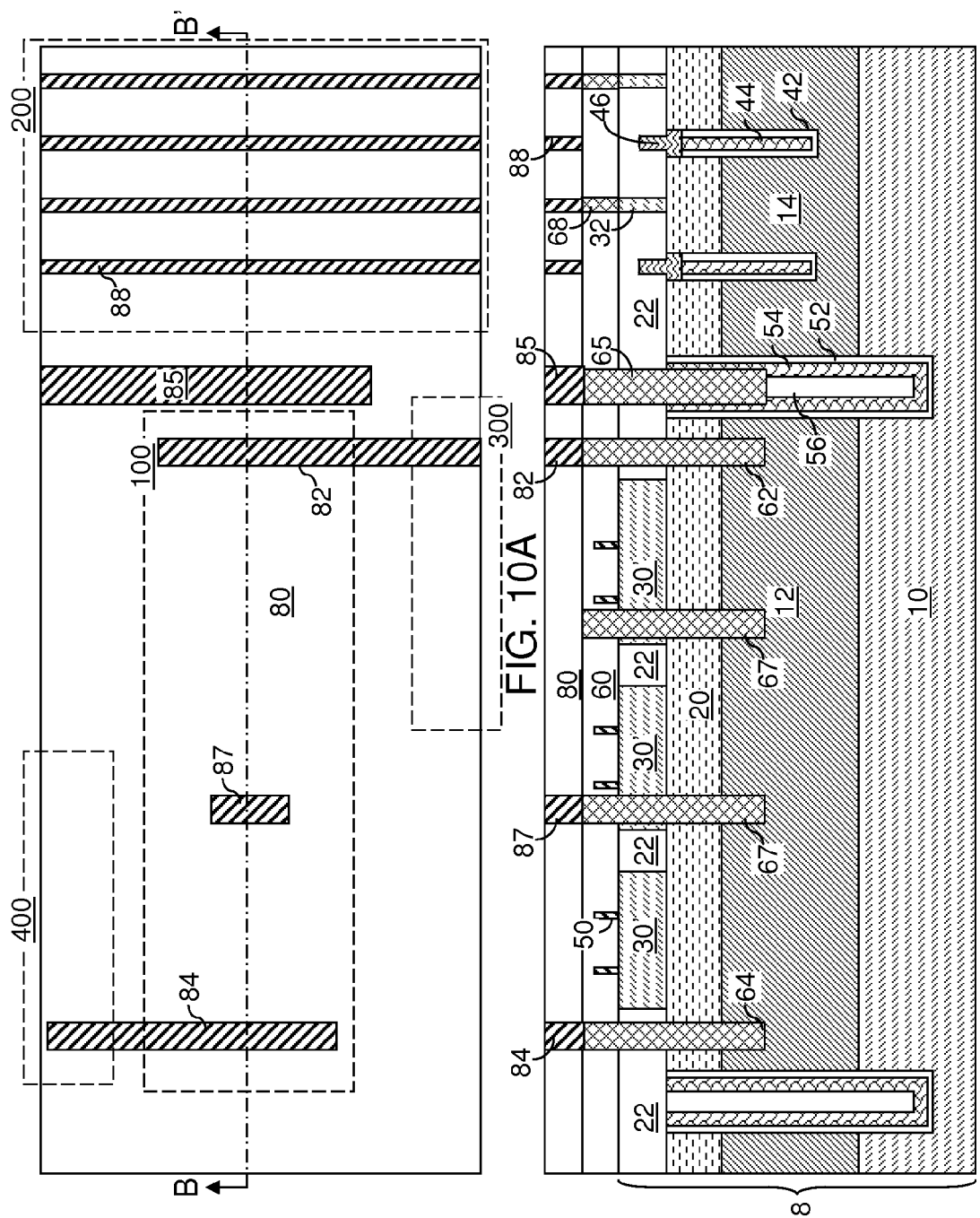

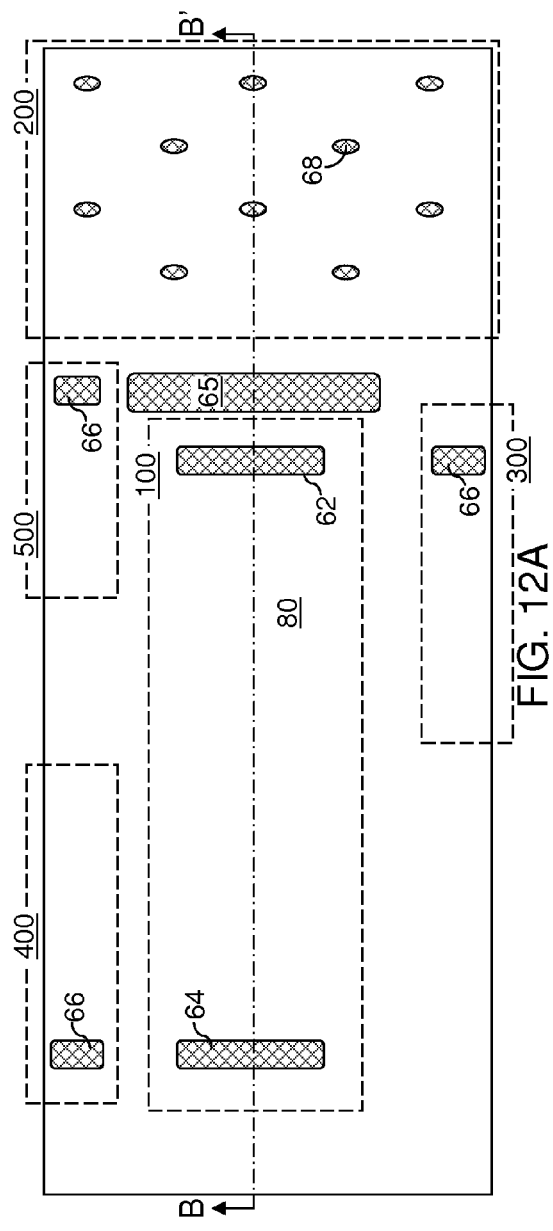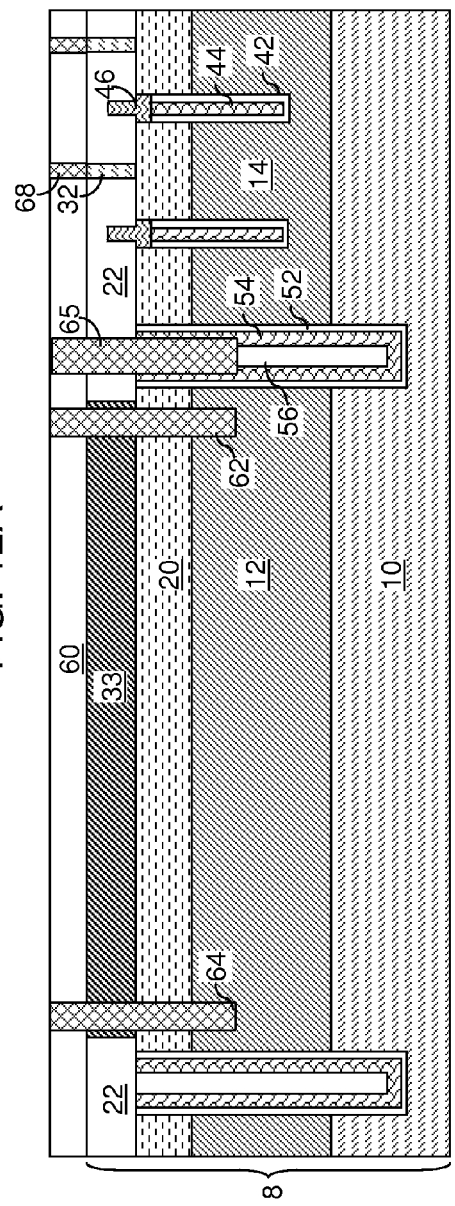

US 9,484,246 B2

1

BURIED SIGNAL TRANSMISSION LINE

BACKGROUND

The present disclosure relates to a semiconductor structure, and particularly to a semiconductor structure including a buried signal transmission line enclosed by a deep trench isolation structure and a method of manufacturing the same.

As the density of semiconductor devices in integrated circuits increases, the density of metal interconnect structures correspondingly increases, and signal transmission among different device regions becomes a greater challenge. A method is thus desired for effectively providing signal transmission among different device regions without increasing the number of wiring levels in the metal interconnect structures and without significantly increasing the total number of processing steps.

SUMMARY

A buried conductive layer is formed underneath a buried insulator layer of a semiconductor-on-insulator (SOI) substrate. A deep isolation trench laterally surrounding a portion of the buried conductive layer is formed, and is filled with at least a dielectric liner to form a deep trench isolation structure. Contact via structures are formed through the buried insulator layer and a top semiconductor layer and onto the portion of the buried conductive layer, which constitutes a buried conductive conduit. The deep trench isolation structure may be formed concurrently with at least one deep trench capacitor. A patterned portion of the top semiconductor layer may be employed as an additional conductive conduit for signal transmission. Further, the deep trench isolation structure may include a conductive portion, which can be electrically biased to control the impedance of the signal path including the buried conductive conduit.

According to an aspect of the present disclosure, a semiconductor structure includes a deep trench isolation structure, a top semiconductor portion, a shallow trench isolation layer, and a pair of contact via structures. The deep isolation trench is embedded within a semiconductor-on-insulator (SOI) substrate and laterally surrounds a vertical stack including, from bottom to top, an upper portion of a semiconductor material layer, a buried conductive portion including a doped semiconductor material, and a portion of a buried insulator layer. The top semiconductor portion overlies the portion of the buried insulator layer. The shallow trench isolation layer laterally surrounds the top semiconductor portion. The pair of contact via structures is laterally spaced from each other and extending at least between a first vertical plane including a top surface of the top semiconductor portion and a second vertical plane located underneath a bottom surface of the buried insulator layer.

According to another aspect of the present disclosure, a method of forming a semiconductor structure is provided. A deep isolation trench is formed through an upper portion of a semiconductor-on-insulator (SOI) substrate. The deep isolation trench laterally surrounds a vertical stack including, from bottom to top, an upper portion of a semiconductor material layer, a buried conductive portion including a doped semiconductor material, a portion of a buried insulator layer, and a top semiconductor portion. A deep trench isolation structure is formed by filling the deep isolation trench with at least a dielectric liner. A shallow trench isolation layer is formed by replacing an upper portion of the deep trench isolation structure and a peripheral portion of the top semiconductor portion with a dielectric material. A

2 pair of contact via structures is formed. Each conductive via structure is laterally spaced from each other and extend at least between a first vertical plane including a top surface of a remaining portion of the top semiconductor portion and a second vertical plane located underneath a bottom surface of the buried conductive portion.

BRIEF DESCRIPTION OF THE SEVERAL VIEWS OF THE DRAWINGS

FIG. 3A is a top-down view of the first exemplary semiconductor structure after formation of a deep trench isolation structure and deep trench capacitors according to the first embodiment of the present disclosure.

FIG. 3B is a vertical cross-sectional view of the first exemplary semiconductor structure along the vertical plane B-B' of FIG. 3A.

FIG. 4A is a top-down view of the first exemplary semiconductor structure after formation of buried straps according to the first embodiment of the present disclosure.

FIG. 4B is a vertical cross-sectional view of the first exemplary semiconductor structure along the vertical plane B-B' of FIG. 4A.

FIG. 6A is a top-down view of the first exemplary semiconductor structure after formation of various semiconductor devices according to the first embodiment of the present disclosure.

FIG. 6B is a vertical cross-sectional view of the first exemplary semiconductor structure along the vertical plane B-B' of FIG. 6A.

FIG. 7A is a top-down view of the first exemplary semiconductor structure after formation of various contact via structures according to the first embodiment of the present disclosure.

FIG. 7B is a vertical cross-sectional view of the first exemplary semiconductor structure along the vertical plane B-B' of FIG. 7A.

FIG. 8A is a top-down view of the first exemplary semiconductor structure after formation of various metal interconnect lines according to the first embodiment of the present disclosure.

FIG. 8B is a vertical cross-sectional view of the first exemplary semiconductor structure along the vertical plane B-B' of FIG. 8A.

FIG. 9A is a top-down view of a variation of the first exemplary semiconductor structure after formation of various semiconductor devices according to the first embodiment of the present disclosure.

FIG. 9B is a vertical cross-sectional view of the first exemplary semiconductor structure along the vertical plane B-B' of FIG. 9A.

FIG. 10A is a top-down view of the variation of the first exemplary semiconductor structure after formation of various metal interconnect lines according to the first embodiment of the present disclosure.

FIG. 10B is a vertical cross-sectional view of the first exemplary semiconductor structure along the vertical plane B-B' of FIG. 10A.

FIG. 12A is a top-down view of the second exemplary semiconductor structure after formation of various contact via structures according to the second embodiment of the present disclosure.

FIG. 12B is a vertical cross-sectional view of the second exemplary semiconductor structure along the vertical plane B-B' of FIG. 12A.

DETAILED DESCRIPTION

Figure 1A:
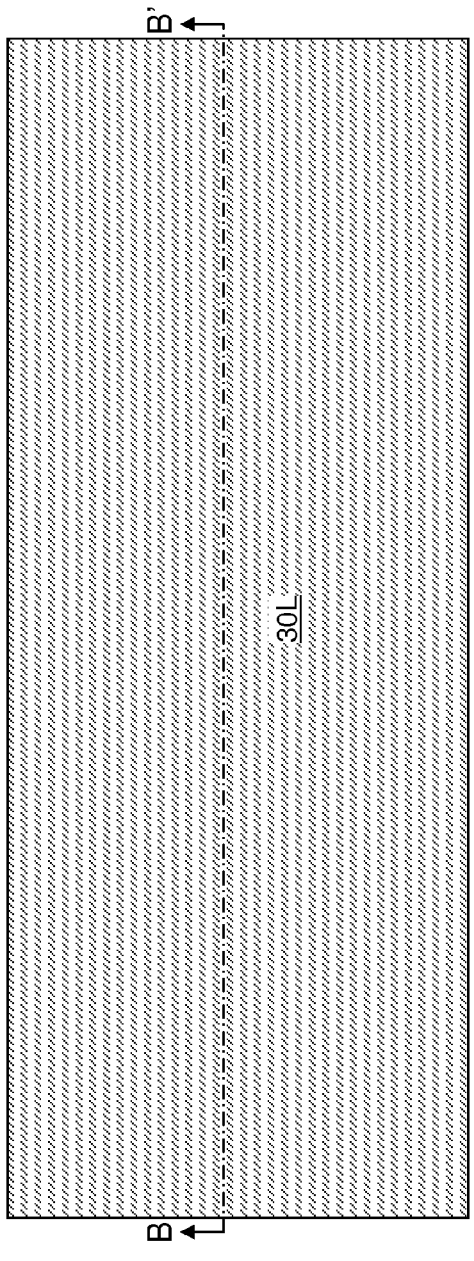
FIG. 1A is a top-down view of a first exemplary semiconductor structure after formation of a buried conductive layer according to a first embodiment of the present disclosure.

As stated above, the present disclosure relates to a semiconductor structure including a buried signal transmission line enclosed by a deep trench isolation structure and a method of manufacturing the same. Aspects of the present disclosure are now described in detail with accompanying figures. It is noted that like reference numerals refer to like elements across different embodiments. The drawings are not necessarily drawn to scale. As used herein, ordinals such as "first," "second," and "third" are employed merely to distinguish similar elements, and different ordinals may be employed to designate a same element in the specification and/or claims.

As used herein, a "deep trench" refers to a trench that extends from a topmost surface of a semiconductor-on-insulator (SOI) substrate through a top semiconductor layer and a buried insulator layer and partly into an underlying semiconductor layer. A "deep isolation trench" refers to a deep trench that electrically isolates two device components. A "deep capacitor trench" refers to a deep trench on which a capacitor is formed.

Figure 1B:
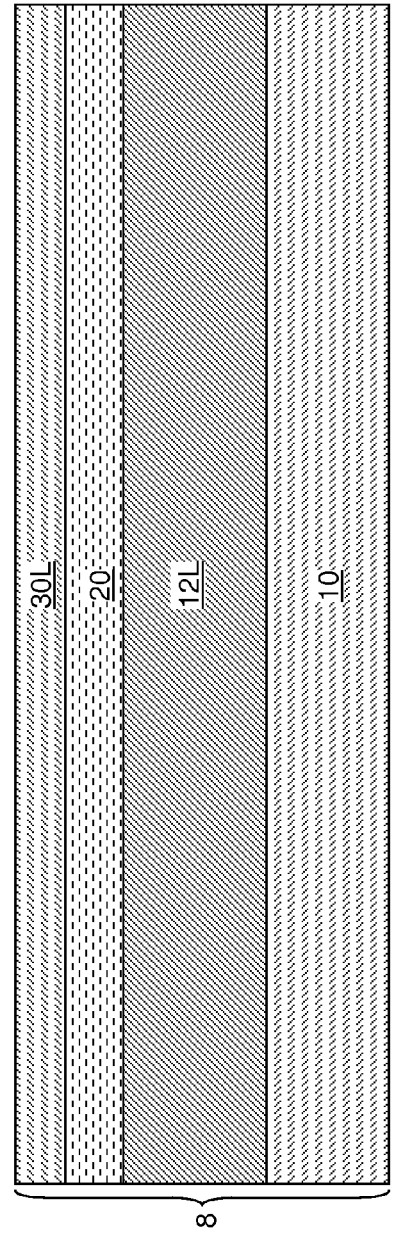
FIG. 1B is a vertical cross-sectional view of the first exemplary semiconductor structure along the vertical plane B-B' of FIG. 1A.

Referring to FIGS. 1A and 1B, a first exemplary semiconductor structure according to a first embodiment of the present disclosure includes a semiconductor-on-insulator substrate 8, which contains a top semiconductor layer 30L, a buried insulator layer 20 located under the top semiconductor layer 30L, and a bottom semiconductor substrate (10, 12L) located under the buried insulator layer 20.

The top semiconductor layer 30L includes a semiconductor material, which can be an elemental semiconductor material, an alloy thereof, a compound semiconductor material, or an organic semiconductor material. In one embodiment, the top semiconductor layer 30L includes a single crystalline semiconductor material such as single crystalline silicon, a single crystalline silicon-germanium alloy, or a single crystalline compound semiconductor material. The thickness of the top semiconductor layer 30L can be in a range from 30 nm to 300 nm, although lesser and greater thicknesses can also be employed. The buried insulator layer 20 includes a dielectric material such as silicon oxide.

The bottom semiconductor substrate (10, 12L) can include a semiconductor material layer 10 and a buried conductive layer 12L. The semiconductor material layer 10 includes a semiconductor material having a doping of a first conductivity type, which can be p-type or n-type. The concentration of the electrical dopants in the semiconductor material layer 10 can be in a range from $1.0 \times 10^{14}/cm^3$ to $3.0 \times 10^{16}/cm^3$, although lesser and greater concentrations can also be employed. The resistivity of the semiconductor material layer 10 can be greater than $1.0 \times 10^{-1}$ Ohm-cm. In one embodiment, the resistivity of the semiconductor material layer 10 can be greater than 1.0 Ohm-cm. Alternately, the semiconductor material layer 10 can include an intrinsic semiconductor material. The semiconductor material layer 10 can be thick enough to provide mechanical support to the buried conductive layer 12L, the buried insulator layer 20, and the top semiconductor layer 30L. For example, the thickness of the semiconductor material layer 10 can be in a range from 30 micron to 2 mm, although lesser and greater thicknesses can also be employed.

The buried conductive layer 12L includes a heavily doped semiconductor material, and can have a resistivity that is less than $1.0 \times 10^{-2}$ Ohm-cm. If the semiconductor material layer 10 has a doping of a first conductivity type, the buried conductive layer 12L has a doping of the opposite conductivity type, which is herein referred to as a second conductivity type. In this case, a p-n junction can be formed at the interface between the buried conductive layer 12L and the semiconductor material layer 10. The concentration of the electrical dopants in the buried conductive layer 12L can be in a range from $3.0 \times 10^{19}/cm^3$ to $3.0 \times 10^{21}/cm^3$, although lesser and greater concentrations can also be employed. The thickness of the buried conductive layer 12L can be in a range from 2 micron to 8 microns, although lesser and greater thicknesses can also be employed.

In one embodiment, the semiconductor material layer 10 can be initially provided, and the buried conductive layer 12L can be formed by epitaxy on the top surface of the semiconductor material layer 10 to form the bottom semiconductor substrate (10, 12L). The buried insulator layer 20 and the top semiconductor layer 30L can be bonded to the bottom semiconductor substrate (10, 12L) by substrate bonding in which a composite substrate including a semiconductor substrate and an insulator layer thereupon is bonded to the top surface of the bottom semiconductor substrate (10, 12L). The bonded insulator layer becomes the buried insulator layer 20. The semiconductor substrate is cleaved, for example, by hydrogen layer-assisted cleaving, and the semiconductor material layer that remains on the buried insulator layer 20 constitutes the top semiconductor layer 30L.

In another embodiment, the bottom semiconductor substrate (10, 12L) can be initially provided as a semiconductor handle substrate within a semiconductor-on-insulator substrate including the buried insulator layer 20 and the top semiconductor layer 30L. The semiconductor handle substrate can have the same composition as the semiconductor material layer 10. Electrical dopants of the second conductivity type can be introduced into the upper portion of the semiconductor handle substrate, for example, by ion implantation, to form the buried conductive layer 12L.

Figure 2A:
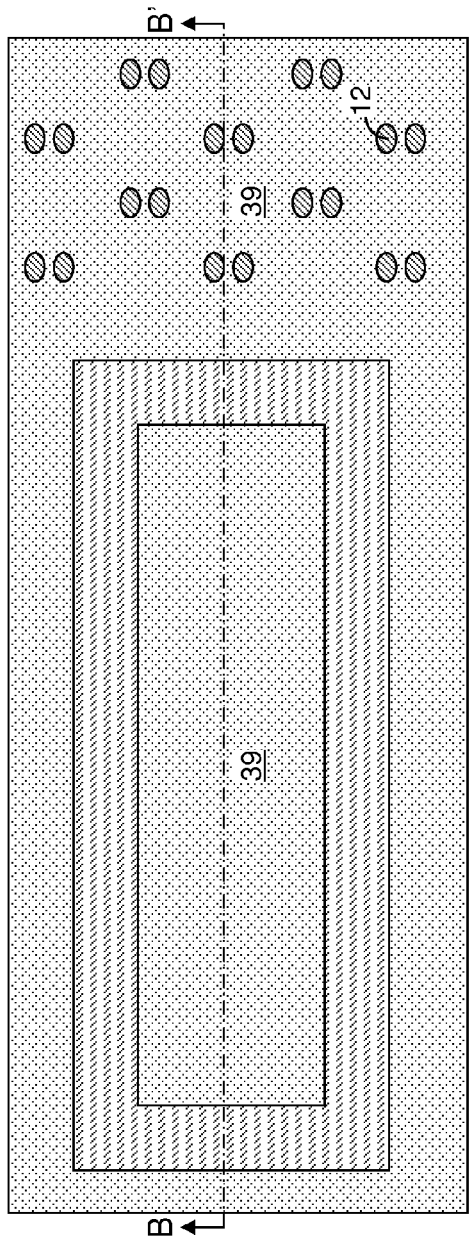
FIG. 2A is a top-down view of the first exemplary semiconductor structure after formation of a deep isolation trench and a plurality of deep capacitor trenches according to the first embodiment of the present disclosure.
Figure 2B:
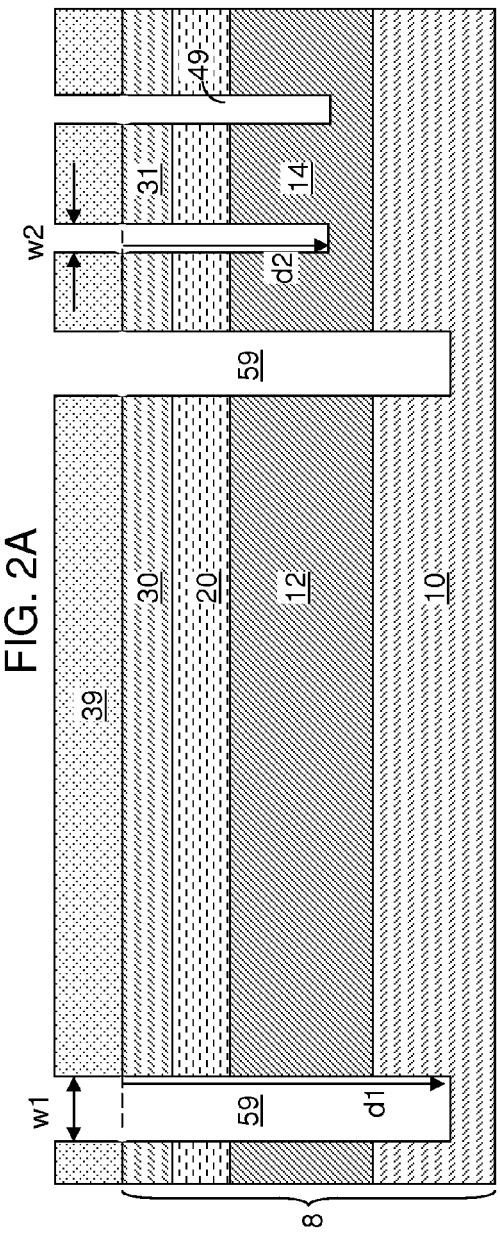
FIG. 2B is a vertical cross-sectional view of the first exemplary semiconductor structure along the vertical plane B-B' of FIG. 2A.

Referring to FIGS. 2A and 2B, a hard mask layer 39 can be formed on the top surface of the SOI substrate 8, for example, by chemical vapor deposition (CVD) or atomic layer deposition (ALD). The hard mask layer 39 can include silicon nitride, a dielectric metal oxide, doped or undoped silicon oxide, or a stack thereof. The thickness of the hard mask layer 39 can be from 100 nm to 1,000 nm, although lesser and greater thicknesses can also be employed.

The hard mask layer 39 can be patterned, for example, by applying a photoresist (not shown) on the top surface of the hard mask layer 39, patterning the photoresist by lithographic exposure and development, transferring the pattern in the photoresist into the hard mask layer 39 by an anisotropic etch, and removing the photoresist by ashing.

The pattern in the hard mask layer 39 is transferred into the SOI substrate 8 by an anisotropic etch that employs the patterned hard mask layer 39 as an etch mask. The openings in the hard mask layer 39 include a first opening having a first width w1 and at least one second opening having a second width w2. The first width w1 is greater than the second width w2. In one embodiment, the first width w1 can be greater than 150% of the second width w2. In another embodiment, the first width w1 can be at least 3 times the second width w2. In an illustrative example, the first width w1 can be about 60 nm, and the second width w2 can be at least 20 nm.

The pattern of the openings in the hard mask layer 39 is transferred into the SOI substrate 8, for example, by an anisotropic etch. A deep isolation trench 59 and at least one deep capacitor trench 49 can be simultaneously formed in the SOI substrate 8 by the anisotropic etch. The deep isolation trench 59 has a first depth d1, as measured from the top surface of the SOI substrate 8, and at least one deep capacitor trench 49 has a second depth d2, as measured from the top surface of the SOI substrate 8.

The deep isolation trench 59 and each deep capacitor trench 49 extend through the top semiconductor layer 30L, the buried insulator layer 20, and at least an upper portion of the buried conductive layer 12L. In one embodiment, the first depth d1 and the second depth d2 are selected such that the deep isolation trench 59 extends through the buried conductive layer 12L and into an upper portion of the first semiconductor layer 10, and the bottom surface of each deep capacitor trench 49 is within the buried conductive layer 12L.

Each deep capacitor trench 49 can be configured for formation of a deep capacitor trench, i.e., can be formed as isolated trench structures having a horizontal cross-sectional area of a circle, an ellipse, a superellipse, or a polygon. In one embodiment, the deep isolation trench 59 can be formed as a moat trench that laterally encloses a device region. Semiconductor devices formed on, or in, the portion of the top semiconductor layer 30L within that device region are electrically isolated from other semiconductor devices formed outside the moat trench.

The top semiconductor layer 30L can be divided into various semiconductor portions, which can include, for example, a top semiconductor portion 30 located within the area of the deep isolation trench 59 and a contiguous top semiconductor portion 31 located outside the area of the deep isolation trench 59. The buried insulator layer 20 can divided into a portion located within the area of the deep isolation trench 59 and another portion located outside the area of the deep isolation trench 59. The buried conductive layer 12L can be divided into a buried conductive portion 12 located within the area of the deep isolation trench 59 and a buried plate 14, which is a contiguous conductive portion laterally surrounding the bottommost portions of the deep capacitor trenches 49. The deep isolation trench 59 is formed through an upper portion of the SOI substrate 8 such that the deep isolation trench 59 laterally surrounds a vertical stack including, from bottom to top, an upper portion of the semiconductor material layer 10, the buried conductive portion 12 including a doped semiconductor material, a portion of a buried insulator layer 20, and the top semiconductor portion 30. The buried plate 14 has the same composition, and the same thickness (i.e., the vertical distance between the top surface and the bottom surface of the buried plate 14), as the buried conductive portion 12.

The bottom surface of the deep isolation trench 59 is formed below a horizontal plane including the bottom surface of the buried conductive portion 12, while a bottom surface of each deep capacitor trench 49 is formed above the horizontal plane. The difference between the first depth d1 and the second depth d2 is caused by the differences in the aspect ratios between the deep isolation trench 59 and the deep capacitor trenches 49. In general, etchant gas has easier access to the bottom of a wider trench than to the bottom of a narrow trench, thereby etching wider trenched to a deeper depth than the narrow trench. Because the second width w2 is less than the first width w1 and the aspect ratio for the deep capacitor trenches 49 is greater than the aspect ratio for the deep isolation trench 59, lesser etchant per etched area reaches the bottom of the deep capacitor trenches 49 during the anisotropic etch than the bottom of the deep isolation trench 59 during the anisotropic etch that forms the deep trenches (49, 59).

Referring to FIGS. 3A and 3B, a contiguous dielectric layer and a conductive fill material layer are sequentially deposited on the sidewalls and bottom surfaces of the deep isolation trench 59 and the at least one deep capacitor trench 49. The contiguous dielectric layer can include any dielectric material that can be employed as a node dielectric of a deep trench capacitor. For example, the contiguous dielectric layer can include silicon nitride or a dielectric metallic nitride. The contiguous dielectric layer can be formed as a single contiguous layer that contacts sidewall surfaces and bottom surfaces of the deep isolation trench 59 and the at least one deep capacitor trench 49 and the top surface and sidewall surfaces of the hard mask layer 39 without any hole therein.

The conductive fill material layer includes a conductive material that can be removed selective to the materials of the contiguous dielectric layer. For example, the conductive fill material layer can include doped semiconductor material or a metallic material.

The contiguous dielectric layer and the conductive fill material layer are deposited conformally, for example, by chemical vapor deposition (CVD) or atomic layer deposition (ALD). The thickness of the contiguous dielectric layer can be from 4 nm to 40 nm, although lesser and greater thicknesses can also be employed. In one embodiment, the sum of the thickness of the contiguous dielectric layer and the thickness of the conductive fill material layer is greater than the one half of the second width w2, and is less than one half of the first width w1. In this case, a cavity is present within the deep isolation trench 59 after deposition of the contiguous dielectric layer and the conductive fill material layer, and each of the at least one second cavity 49 is completely filled with the contiguous dielectric layer and the conductive fill material layer. A second fill material can be deposited into the cavity within the deep isolation trench 59. The second fill material can be a dielectric fill material or another conductive fill material.

In another embodiment, the sum of the thickness of the contiguous dielectric layer and the thickness of the conductive fill material layer can be greater than one half of the first width w1. In this case, the conductive fill material layer completely fills the deep isolation trench 59.

Any portion of the second fill material (if present), the conductive fill material layer, and the contiguous dielectric layer are removed from above a horizontal plane including the top surface of the hard mask layer 39 by a planarization process. The planarization process can employ a recess etch, chemical mechanical planarization (CMP), or a combination thereof.

A contiguous remaining portion of the contiguous dielectric layer that remains within the deep isolation trench 59 (See FIGS. 2A and 2B) constitutes a dielectric liner 52. Each remaining portion of the contiguous dielectric liner that remains in a deep capacitor trench 49 (See FIGS. 2A and 2B) constitutes a node dielectric 42. A contiguous remaining portion of the conductive fill material layer that remains within the deep isolation trench 59 constitutes a conductive fill material portion 54. Each remaining portion of the conductive fill material layer that remains in a deep capacitor trench 49 constitutes an inner electrode 44. If a second fill material is employed, the remaining contiguous portion of the second fill material constitutes an inner fill material portion 56, which can include a dielectric material or a conductive material. Each of the dielectric liner 52, the conductive fill material portion 54, and the inner fill material portion 56 can be topologically homeomorphic to a torus, i.e., can be contiguously stretched without forming or destroying a hole to the shape of a torus.

A deep trench isolation structure (52, 54, 56) including the dielectric liner 52, the conductive fill material portion 54, and the inner fill material portion 56 fills the deep isolation trench 59. Within the deep trench isolation structure, the conductive fill material portion 54 is formed directly on inner sidewalls of the dielectric liner 52. Each combination of a node dielectric 42, an inner electrode 44 contacting the node dielectric 42, and a portion of the buried plate 14 that contacts the node dielectric 42 constitutes a deep trench capacitor (14, 42, 44).

Referring to FIGS. 4A and 4B, a photoresist layer (not shown) can be applied over the top surface of the hard mask layer 39, and can be lithographically patterned to cover an area overlying, or enclosed by, the deep trench isolation structure (52, 54, 56), while physically exposing the top surfaces of the node dielectrics 42 and the inner electrodes 44. A recess etch can be performed to recess the inner electrodes 44 so that the top surfaces of the inner electrodes 44 are recessed to a height between the top surface and the bottom surface of the buried insulator layer 20. Physically exposed portions of the node dielectrics 42 can be removed, for example, by an isotropic etch such as a wet etch. The photoresist layer can be subsequently removed.

Buried strap structures 46 can be formed in the upper portions of the deep capacitor trenches 49 (See FIGS. 2A and 2B) by deposition and an optional recess etch of a conductive material. If performed, the depth of the recess of the conductive material can be selected such that the top surfaces of the buried strap structures 46 can be below the top surface of the contiguous top semiconductor portion 31 after etch processes to be subsequently performed.

Figure 5A:
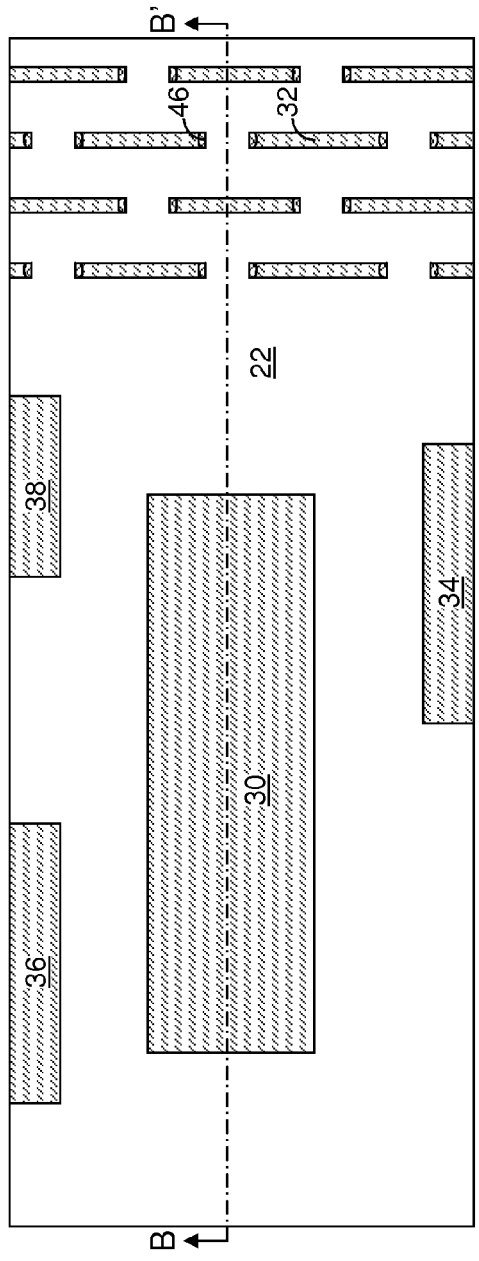
FIG. 5A is a top-down view of the first exemplary semiconductor structure after formation of a shallow trench isolation layer according to the first embodiment of the present disclosure.
Figure 5B:
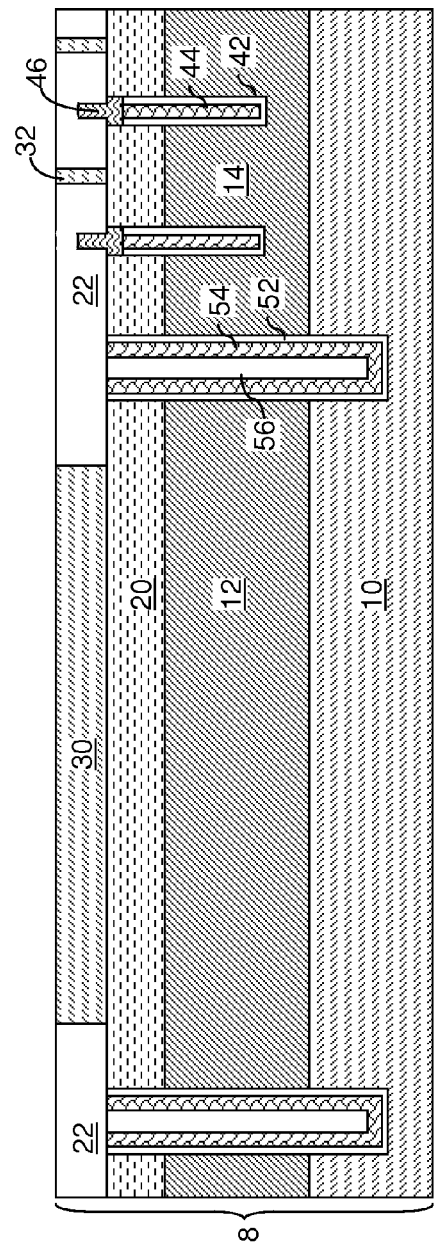
FIG. 5B is a vertical cross-sectional view of the first exemplary semiconductor structure along the vertical plane B-B' of FIG. 5A.

Referring to FIGS. 5A and 5B, the hard mask layer 39 can be patterned to cover regions corresponding to the complement of the area in which a shallow trench isolation layer 22 is to be formed. The patterning of the hard mask layer 39 can be performed, for example, by applying a photoresist layer over the hard mask layer, lithographically patterning the photoresist layer, and transferring the pattern in the photoresist layer into the hard mask layer 39 employing an anisotropic etch. The photoresist layer is subsequently removed, for example, by ashing.

The pattern in the hard mask layer 39 is transferred into the layer including the top semiconductor portion 30 and the contiguous top semiconductor portion 31 by an anisotropic etch. In one embodiment, upper portion of the deep trench isolation structure (52, 54, 56) and a peripheral portion of the top semiconductor portion. 30 can be removed by the anisotropic etch. In one embodiment, the area of an opening in the hard mask layer 39 can include the entire area of the top surface of the deep trench isolation structure (52, 54, 56). The top surfaces of the buried strap structure 46 can be can be recessed to a height between the top surface and the bottom surface of the contiguous top semiconductor portion 31. The buried strap structures 46 can be employed as conductive paths between each deep trench capacitor (14, 42, 44) and an access transistor to be subsequently formed employing remaining portions of the contiguous top semiconductor portion 31 that contact the buried strap structures 46 and are herein referred to as access transistor active regions 32.

A contiguous shallow trench laterally surrounding various remaining portions of the top semiconductor portion 30 and the contiguous top semiconductor portion 31 is formed. The shallow trench extends from the top surface of the hard mask layer 39 at least to the top surface of the buried insulator layer 20. The bottom surface of the contiguous shallow trench can be coplanar with, or can be formed below, the top surface of the buried insulator layer 20.

The remaining portions of the contiguous top semiconductor portion 31 includes the access transistor active regions 32, a first device active region 34, a second device active region 36, and a bias device active region 38. The access transistor active regions 32 are semiconductor material portions in which source regions, drain regions, and body regions of access transistors for the deep trench capacitors (14, 42, 44) are to be subsequently formed. The first device active region 34 is a semiconductor material portion in which a first semiconductor device having at least one output node is to be subsequently formed. The second device active region 36 is a semiconductor material portion in which a second device having at least one input node is to be subsequently formed. The bias device active region 38 is a semiconductor material portion in which at least one semiconductor device to generate an electrical bias voltage is to be subsequently formed.

A dielectric material such as silicon oxide is deposited into the contiguous shallow trench to form a shallow trench isolation layer 22. Excess portions of the dielectric material above the horizontal plane including the top surface of the hard mask layer 39 can be removed by a planarization process, which can employ a recess etch, chemical mechanical planarization (CMP), or a combination thereof. Further, the top surface of the shallow trench isolation layer 22 can be recessed below the top surface of the hard mask layer 39 by a recess etch. The recessed surface of the shallow trench isolation layer 22 can be at, above, or below, the plane including the top surface of the top semiconductor portion 30.

The hard mask layer 39 can be subsequently removed by an isotropic etch such as a wet etch. For example, if the hard mask layer 39 includes silicon oxide, the hard mask layer 39 can be removed by a wet etch process employing hot phosphoric acid.

The upper portion of the deep trench isolation structure (52, 54, 56) and a peripheral portion of the top semiconductor portion 30 are replaced with a dielectric material by formation of the shallow trench isolation layer 22. The deep trench isolation structure (52, 54, 56) includes a dielectric liner 52 in contact with the semiconductor material layer 10, the buried conductive portion 12, and the buried insulator layer 20. Each deep trench capacitor (14, 42, 44) includes a node dielectric 42 having the same composition, and the same thickness as, the dielectric liner 52. The bottom surface of the deep trench isolation structure (52, 54, 56) is located below the horizontal plane including the bottom surface of the buried conductive portion 12, and the bottom surface of each deep capacitor trench is located above the horizontal plane. The shallow trench isolation layer 22 overlies the deep trench isolation structure (52, 54, 56) and laterally surrounds the top semiconductor portion 30.

Referring to FIGS. 6A and 6B, various semiconductor devices are formed in, and/or over, the various semiconductor portions (30, 32, 34, 36, 38) employing methods known in the art. For example, various gate lines 50 including a vertical stack of a gate dielectric and a gate electrode can be formed on the top surfaces of the various semiconductor portions (30, 32, 34, 36, 38). Source regions and drain regions (not shown) and gate spacers (not shown) can be formed employing methods known in the art.

A first device region 100 includes a deep trench isolation structure (52, 54, 56) embedded within a semiconductor-on-insulator (SOI) substrate 8 and laterally surrounding a vertical stack that contains, from bottom to top, an upper portion of the semiconductor material layer 10, and the buried conductive portion 12 including the doped semiconductor material, and a portion of a buried insulator layer 20. The first device region 100 further includes the top semiconductor portion 30, which overlies an underlying portion of the buried insulator layer 20. The dielectric liner 52 within the deep trench isolation structure (52, 54, 56) is in contact with the semiconductor material layer 10, the buried conductive portion 12, and the buried insulator layer 20. The conductive fill material portion 54 within the deep trench isolation structure (52, 54, 56) is embedded within the dielectric liner 52.

A second device region 200 includes deep trench capacitors (14, 42, 44) and the access transistors for the deep trench capacitors (14, 42, 44). The access transistors are formed in, and over, the access transistor active regions 32. The access transistors control the flow of electrical charges into, and out of, the inner electrodes 44 of the deep trench capacitors (14, 42, 44).

A third device region 300 includes the first device active region 34. A first semiconductor device is formed in, and/or over, the first device active region 34. The first semiconductor device includes at least one output node. In one embodiment, the first semiconductor device can be a signal processor configured to output a processed signal through the at least one output node.

A fourth device region 400 includes the second device active region 36. A second semiconductor device is formed in, and/or over, the second device active region 36. The second semiconductor device includes at least one input node. In one embodiment, the second semiconductor device can be a signal processor configured to receive an input signal through the at least one input node.

A fifth device region 500 includes the bias device active region 38. At least one semiconductor device configured to generate an electrical bias voltage can be formed in, and/or over, the bias device active region 38. The fifth device region 500 is optional.

Referring to FIGS. 7A and 7B, a via level dielectric layer 60 is formed over the various semiconductor portions (30, 32, 34, 36, 38) and the shallow trench isolation layer 22. The via level dielectric layer 60 is one of dielectric layers within a metal interconnect structure that provides electrical connections among various devices on the various semiconductor portions (30, 32, 34, 36, 38). The via level dielectric layer 60 includes a dielectric material such as undoped silicate glass, doped silicate glass, organosilicate glass (OSG), and/or silicon nitride. The via level dielectric layer 60 can be deposited, for example, by chemical vapor deposition. Optionally, the top surface of the via level dielectric layer 60 can be planarized, for example, by chemical mechanical planarization. The thickness of the via level dielectric layer 60 can be in a range from 100 nm to 500 nm, although lesser and greater thicknesses can also be employed.

Various contact via structures (62, 64, 65, 66, 68) can be formed at least through the via level dielectric layer 60. The various contact via structures (62, 64, 65, 66, 68) include at least a first contact via structure 62 that extends through the via level dielectric layer 60, through a first portion of the shallow trench isolation layer 22 that overlies a first peripheral portion of the buried conductive portion 12, through a portion of the buried insulator layer 20 laterally surrounded within the deep trench isolation structure (52, 54, 56), and through a top portion of the first peripheral portion of the buried conductive portion 12. The various contact via structures (62, 64, 65, 66, 68) includes at least a second contact via structure 64 that extends through the via level dielectric layer 60, through a second portion of the shallow trench isolation layer 22 that overlies a second peripheral portion of the buried conductive portion 12, through the portion of the buried insulator layer laterally surrounded within the deep trench isolation structure (52, 54, 56), and through a top portion of the second peripheral portion of the buried conductive portion 12. In one embodiment, the first contact via structure 62 can be formed in proximity to the third device region 300, and the second contact via structure 64 can be formed in proximity to the fourth device region 400. The first and second contact via structures (62, 64) constitutes a pair of contact via structures (62, 64) laterally spaced from each other and extending at least between a first vertical plane including the top surface of a remaining portion of the top semiconductor portion 30 and a second vertical plane located underneath a bottom surface of the buried insulator layer 20. The pair of conductive via structures (62, 64) is formed through the shallow trench isolation layer 22.

The various contact via structures (62, 64, 65, 66, 68) further include an additional contact via structure in contact with the conductive fill material portion 54. The additional contact via structure is herein referred to as a third contact via structure 65, which extends from the top surface of the via level dielectric layer 60 through the shallow trench isolation layer 22 and into the deep trench isolation structure (52, 54, 56). The first, second, and third contact via structures (62, 64, 65) can be formed simultaneously.

Additional contact via structures 66 can be formed on the first semiconductor device, the second semiconductor device, and the semiconductor device configured to generate an electrical bias voltage in the third, fourth, and fifth device regions (300, 400, 500), respectively. Further, bit line contact via structures 68 can be formed through the via level dielectric layer 60 to provide electrical contact to drain regions of the access transistors.

Referring to FIGS. 8A and 8B, a line level dielectric layer 80 and various metal interconnect lines (82, 84, 85, 88) embedded in the line level dielectric layer 80 are formed to provide lateral electrical connections among various semiconductor devices. The various metal interconnect lines (82, 84, 85, 88) includes at least a first metal interconnect line 82 that provides an electrically conductive path between the first contact via structure 62 and a contact via structure 66 electrically shorted to the output node of the first semiconductor device. The various metal interconnect lines (82, 84, 85, 88) includes at least a second metal interconnect line 84 that provides an electrically conductive path between the second contact via structure 64 and a contact via structure 66 electrically shorted to the input node of the second semiconductor device.

The various metal interconnect lines (82, 84, 85, 88) further include a third metal interconnect line 85, which electrically shorts the output node of the at least one semiconductor device configured to generate an electrical bias voltage and the conductive fill material portion 54 within the deep trench isolation structure (52, 54, 56). Additional metal interconnect lines 88 configured to function as bit lines for the access transistors can be formed in the second device region 200.

The output node of the first semiconductor device in the third device region 300 is electrically shorted to one of the pair of conductive via structures (62, 64), i.e., the first conductive via structure 62, through a first set of metal interconnect structures including a contact via structure 66 in the third device region 300 and the first metal interconnect line 82. The input node of the second semiconductor device in the fourth device region 400 is electrically shorted to another of the pair of conductive via structures (62, 64), i.e., the second conductive via structure 64, through a second set of metal interconnect structures including another contact via structure 66 in the fourth device region 400 and the second metal interconnect line 84. The pair of conductive via structures (62, 64) is laterally spaced from, and electrically isolated from, the top semiconductor portion 30 by a portion of the shallow trench isolation layer 22.

The at least one semiconductor device in the fifth device region 500 and a metal interconnect structure (65, 66, 85) are configured to apply a non-zero electrical bias voltage to the conductive fill material portion 54 with respect to the semiconductor material layer 10. It is understood that the fifth device region 500, the third contact via structure 65, and the third metal interconnect line 85 are optional, and may not be formed.

The buried conductive portion 12 functions as a conductive signal path between the first contact via structure 62 and the second contact via structure 64. Thus, the buried conductive portion 12 can be employed as a conductive signal path between the first semiconductor device in the third device region 300 and the second semiconductor device in the fourth device region 400. The resistance of the buried conductive portion 12 determines the resistance of the conductive path between the first and second contact via structures (62, 64).

If at least one semiconductor device configured to apply a non-zero electrical bias voltage to the conductive fill material portion 54 is provided in the fifth device region 500, the non-zero electrical bias voltage can be employed to change charge distribution around the deep trench isolation structure (52, 54, 56). The change in the charge distribution can be effected by formation/modulation of a depletion region and/or accumulation region in the portions of the buried conductive portion 12 and/or the buried plate 14 in proximity to the dielectric liner 52. The change in the capacitance of the buried conductive portion 12 modulate the capacitance of the conductive path, and thus, modulates the characteristic impedance of the signal path defined by the buried conductive portion 12 and the deep trench isolation structure (52, 54, 56) laterally surrounding the buried conductive portion 12. The ability to modulate the characteristic impedance of the signal path can be advantageously employed to control the properties of the signals that are transmitted through the buried conductive portion 12.

Referring to FIGS. 9A and 9B, a variation of the first exemplary semiconductor structure is shown at the processing step corresponding to a processing step of FIGS. 6A and 6B. A plurality of top semiconductor portions 30' can be within an area defined by inner sidewalls of the deep trench isolation structure (52, 54, 56). In this case, various semiconductor devices can be formed in, or on, the various top semiconductor portions 30' overlying, and located entirely within the area of, the buried conductive portion 12.

Referring to FIGS. 10A and 10B, the processing steps of FIGS. 7A, 7B, 8A, and 8B are performed to form a metal interconnect structure (60, 62, 64, 65, 66, 67, 68, 80, 82, 84, 85, 87, 88) over the SOI substrate 8. Optionally, at least one device contact via structure 67 can be formed through the via level dielectric layer 60, one or more of the plurality of top semiconductor portions 30', the buried insulator layer 20, and an upper portion of the buried conductive portion 12. Optionally, one or more device metal interconnect line 87 can be formed on one, or more, or none, of the at least one device contact via structure 67.

Figure 11A:
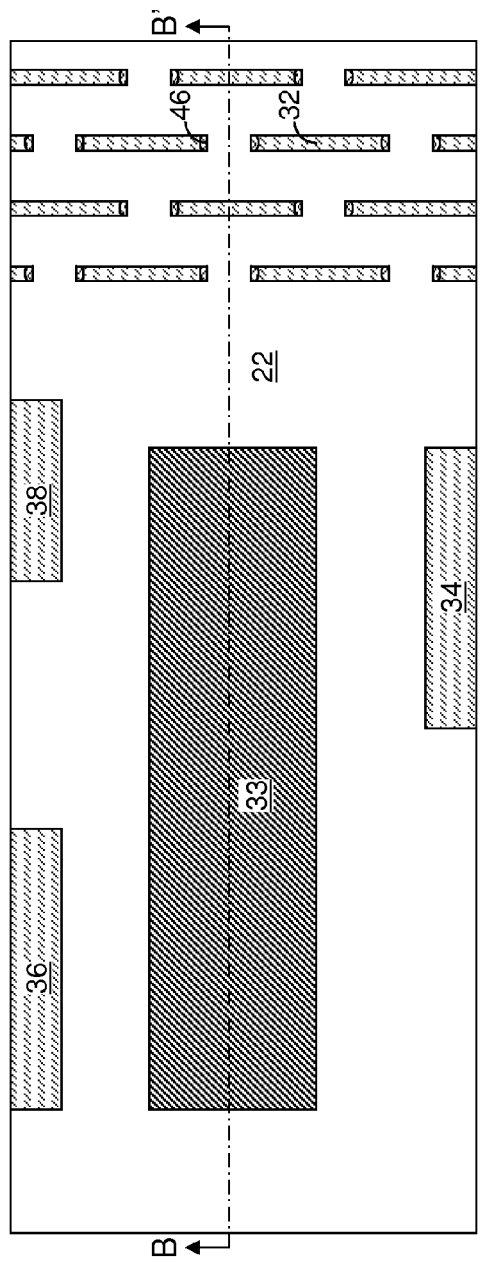
FIG. 11A is a top-down view of a second exemplary semiconductor structure after formation of a conductive top semiconductor portion according to a second embodiment of the present disclosure.
Figure 11B:
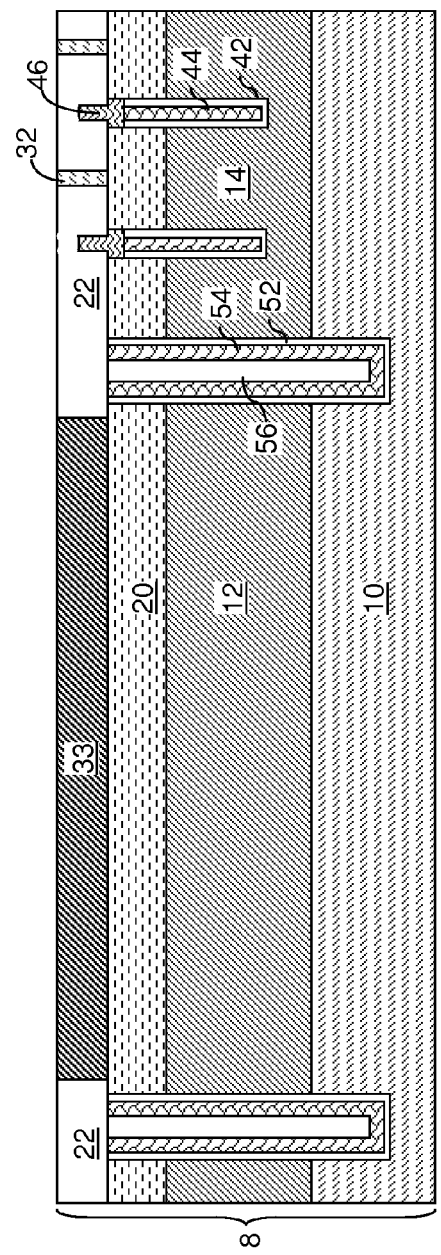
FIG. 11B is a vertical cross-sectional view of the second exemplary semiconductor structure along the vertical plane B-B' of FIG. 11A.

Referring to FIGS. 11A and 11B, a second exemplary semiconductor structure according to a second embodiment of the present disclosure can be derived from the first exemplary semiconductor structure of FIGS. 5A and 5B by doping the top semiconductor portion 30 with electrical dopants of p-type or n-type so that the top semiconductor portion 30 is converted into a conductive material portion 33. The conductive material portion 33 can be formed by introducing the electrical dopants into the top semiconductor portion 30, for example, by a masked ion implantation process. During the masked ion implantation process, a patterned ion implantation mask layer such as a patterned photoresist layer can be employed to block implantation of ions into semiconductor material portions other than the top semiconductor portion 30. The patterned ion implantation mask layer can be subsequently removed, for example, by ashing.

The conductive material portion 33 includes a heavily doped semiconductor material, and can have a resistivity that is less than $1.0 \times 10^{-2}$ Ohm-cm. The concentration of the electrical dopants in the conductive material portion 33 can be in a range from $3.0 \times 10^{19}/\text{cm}^3$ to $3.0 \times 10^{21}/\text{cm}^3$, although lesser and greater concentrations can also be employed.

Referring to FIGS. 12A and 12B, the processing steps of FIGS. 6A, 6B, 7A, and 7B can be performed to form various semiconductor devices, a via level dielectric layer 60, and various contact via structures (60, 62, 64, 65, 66, 68).

Figures 13A, 13B:
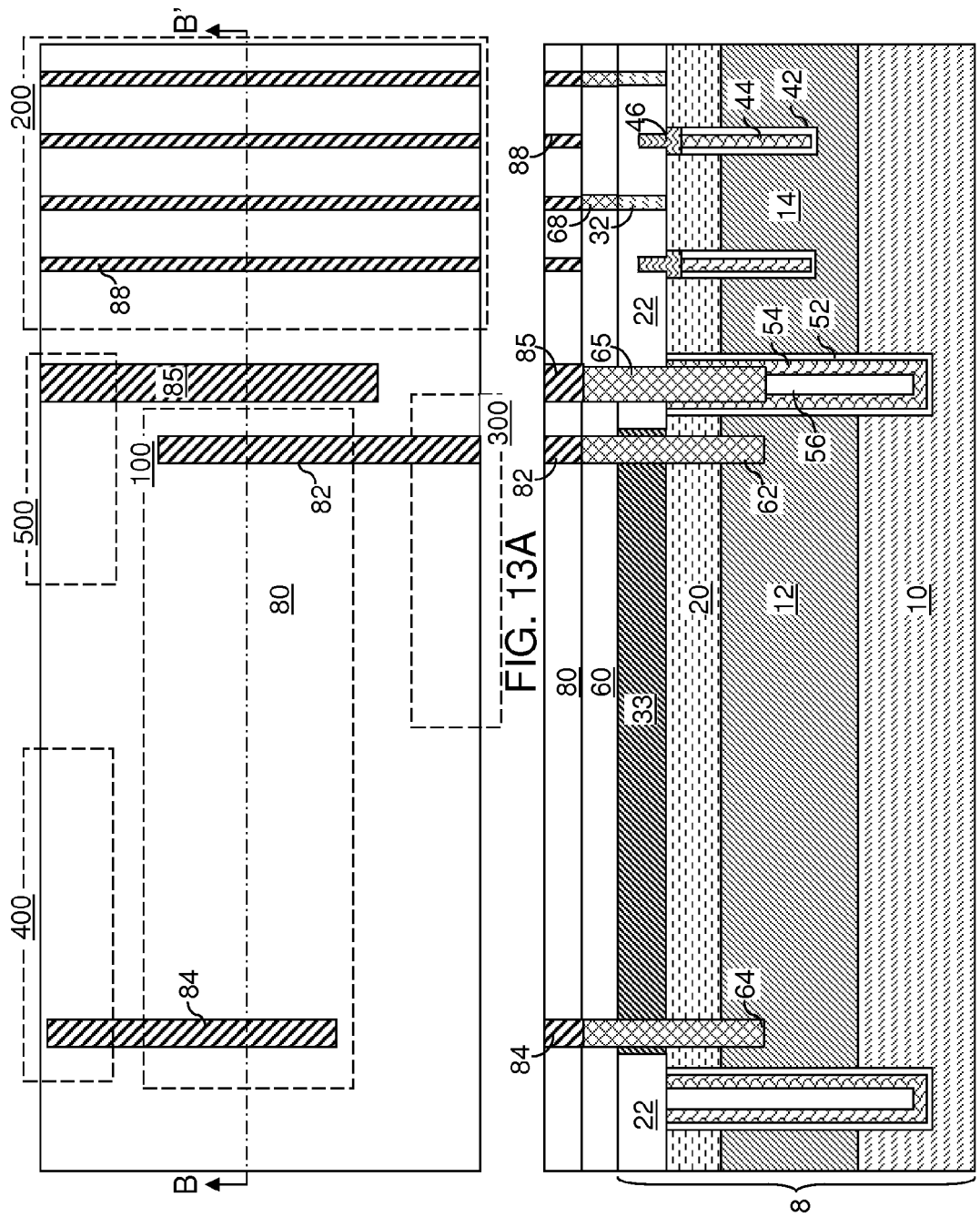
FIG. 13A is a top-down view of the second exemplary semiconductor structure after formation of various metal interconnect lines according to the second embodiment of the present disclosure.
FIG. 13B is a vertical cross-sectional view of the second exemplary semiconductor structure along the vertical plane B-B' of FIG. 13A.

Referring to FIGS. 13A and 13B, a line level dielectric layer 80 and various metal interconnect lines (82, 84, 85, 88) can be formed employing the methods of FIGS. 8A and 8B.

The combination of the buried conductive portion 12 and the conductive material portion 33 functions as a conductive signal path between the first contact via structure 62 and the second contact via structure 64. Thus, the combination of the buried conductive portion 12 and the conductive material portion 33 can be employed as a conductive signal path between the first semiconductor device in the third device region 300 and the second semiconductor device in the fourth device region 400. The resistance of the combination of the buried conductive portion 12 and the conductive material portion 33 determines the resistance of the conductive path between the first and second contact via structures (62, 64).

If at least one semiconductor device configured to apply a non-zero electrical bias voltage to the conductive fill material portion 54 is provided in the fifth device region 500, the non-zero electrical bias voltage can be employed to change charge distribution around the deep trench isolation structure (52, 54, 56). The change in the charge distribution can be effected by formation/modulation of a depletion region and/or accumulation region in the portions of the buried conductive portion 12 and/or the buried plate 14 in proximity to the dielectric liner 52. The change in the capacitance of the buried conductive portion 12 modulate the capacitance of the conductive path, and thus, modulates the characteristic impedance of the signal path defined by the combination of the buried conductive portion 12, the conductive material portion 33 and the deep trench isolation structure (52, 54, 56) laterally surrounding the buried conductive portion 12. The ability to modulate the characteristic impedance of the signal path can be advantageously employed to control the properties of the signals that are transmitted through the buried conductive portion 12.

The methods for forming the signal paths of the present disclosure are compatible with formation of deep trench capacitors (14, 42, 44). Formation of the deep trench capacitors (14, 42, 44) is optional, i.e., not required, for formation of the signal paths of the present disclosure.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising: a deep trench isolation structure embedded within a semiconductor-on-insulator (SOI) substrate and laterally surrounding a vertical stack including, from bottom to top, an upper portion of a semiconductor material layer, a buried conductive portion comprising a doped semiconductor material, and a portion of a buried insulator layer;
a top semiconductor portion overlying said portion of said buried insulator layer; a shallow trench isolation layer laterally surrounding said top semiconductor portion;
a via dielectric layer located on a topmost surface of said shallow trench isolation layer and a topmost surface of said top semiconductor portion; and
a pair of contact via structures laterally spaced from each other by a portion of said via dielectric layer and extending below a topmost surface of said buried conductive portion, wherein a topmost source of each contact structure of said pair of contact structures is coplanar with a topmost surface of said via dielectric layer.

2. The semiconductor structure of claim 1, wherein said deep trench isolation structure comprises:
a dielectric liner in contact with said semiconductor material layer, said buried conductive portion, and said buried insulator layer; and
a conductive fill material portion embedded within said dielectric liner.

3. The semiconductor structure of claim 2, further comprising:
an additional contact via structure in contact with said conductive fill material portion; and
a semiconductor device and a metal interconnect structure that are configured to apply a non-zero electrical bias voltage to said conductive fill material portion with respect to said semiconductor material layer.

4. The semiconductor structure of claim 1, further comprising a deep trench capacitor that includes a buried plate having a same composition and a same thickness as said buried conductive portion.

5. The semiconductor structure of claim 4, wherein said deep trench isolation structure comprises a dielectric liner in contact with said semiconductor material layer, said buried conductive portion, and said buried insulator layer, and said deep trench capacitor comprises a node dielectric having a same composition and a same thickness as said dielectric liner.

6. The semiconductor structure of claim 4, wherein a bottom surface of said deep trench isolation structure is located below a horizontal plane including a bottom surface of said buried conductive portion, and a bottom surface of said deep capacitor trench is located above said horizontal plane.

7. The semiconductor structure of claim 1, wherein said pair of conductive via structures is laterally spaced from, and electrically isolated from, said top semiconductor portion by a portion of said shallow trench isolation layer.

8. The semiconductor structure of claim 1, wherein said top semiconductor portion is electrically shorted to said pair of conductive via structures.

9. The semiconductor structure of claim 1, wherein said shallow trench isolation layer overlies said deep trench isolation structure and laterally surrounds said top semiconductor portion.

10. The semiconductor structure of claim 1, further comprising:
a first semiconductor device located on said substrate and including an output node that is electrically shorted to one of said pair of conductive via structures through a first set of metal interconnect structures; and
a second semiconductor device located on said substrate and including an input node that is electrically shorted to another of said pair of conductive via structures through a second set of metal interconnect structures.

* * * * *